US009686867B2

(12) United States Patent
Rus et al.

(10) Patent No.: US 9,686,867 B2
(45) Date of Patent: Jun. 20, 2017

(54) FOLDABLE MACHINES

(71) Applicants: Daniela Rus, Weston, MA (US); Robert J. Wood, Cambridge, MA (US); Cagdas Denizel Onal, Cambridge, MA (US); Michael Tolley, Cambridge, MA (US)

(72) Inventors: Daniela Rus, Weston, MA (US); Robert J. Wood, Cambridge, MA (US); Cagdas Denizel Onal, Cambridge, MA (US); Michael Tolley, Cambridge, MA (US)

(73) Assignees: Massachussetts Institute of Technology, Cambridge, MA (US); President and Fellows of Harvard College, Cambridge, MA (US)

( * ) Notice: Subject to any disclaimer, the term of this patent is extended or adjusted under 35 U.S.C. 154(b) by 346 days.

(21) Appl. No.: 13/723,364

(22) Filed: Dec. 21, 2012

(65) Prior Publication Data

US 2014/0078699 A1     Mar. 20, 2014

Related U.S. Application Data

(60) Provisional application No. 61/702,040, filed on Sep. 17, 2012.

(51) Int. Cl.
*H05K 1/18*     (2006.01)
*H05K 3/06*     (2006.01)
(Continued)

(52) U.S. Cl.
CPC ............. *H05K 1/189* (2013.01); *H05K 1/028* (2013.01); *H05K 3/06* (2013.01); *H05K 3/0005* (2013.01); *H05K 3/0052* (2013.01); *H05K 2201/052* (2013.01); *H05K 2201/053* (2013.01); *H05K 2201/0909* (2013.01); *H05K 2201/09063* (2013.01); *H05K 2203/1453* (2013.01); *Y10T 29/4913* (2015.01); *Y10T 29/49155* (2015.01)

(58) Field of Classification Search
CPC .......... H05K 1/028; H05K 1/189; H05K 3/30; H05K 3/06–3/07; H05K 3/10–3/18; Y10T 29/4913; Y10T 29/49155
See application file for complete search history.

(56) References Cited

U.S. PATENT DOCUMENTS

| 4,853,317 | A | * | 8/1989 | Hayes | .............. | G03F 7/2018 |
| | | | | | | 430/318 |
| 2005/0036783 | A1 | * | 2/2005 | Morita | .............. | G03F 7/2053 |
| | | | | | | 396/611 |

(Continued)

FOREIGN PATENT DOCUMENTS

| EP | 1 176 542 A2 | 1/2002 |
| EP | 1 176 548 A2 | 1/2002 |

(Continued)

OTHER PUBLICATIONS

U.S. Appl. No. 14/705,493, filed May 6, 2015, Daniela L. Rus, et al.

(Continued)

*Primary Examiner* — Livius R Cazan
(74) *Attorney, Agent, or Firm* — Daly, Crowley, Mofford & Durkee, LLP

(57) ABSTRACT

Methods to systematize the development of machines using inexpensive, fast, and convenient fabrication processes are disclosed. In an embodiment, a folding pattern and corresponding circuit design can provide the blueprints for fabrication. The folding pattern may be provided (e.g. laser machined) on a flat sheet of substrate material, such as a polymer. The circuit pattern may be generated by etching or applying (e.g. sputtering) a copper foil layer onto the substrate. Circuit components and actuators may then be added at specified locations. The flat substrate may then be folded along the predefined locations to form the final machine. The machine may operate autonomously to perform a task.

12 Claims, 9 Drawing Sheets

(51) Int. Cl.
*H05K 3/00* (2006.01)
*H05K 1/02* (2006.01)

(56) References Cited

U.S. PATENT DOCUMENTS

| 2005/0146551 | A1* | 7/2005 | Yamazaki | G02F 1/136286 |
| | | | | 347/20 |
| 2009/0043543 | A1* | 2/2009 | Durney | B21D 11/20 |
| | | | | 703/1 |
| 2010/0002402 | A1 | 1/2010 | Rogers et al. | |
| 2011/0287228 | A1 | 11/2011 | Durney et al. | |
| 2013/0269336 | A1* | 10/2013 | O'Connell | F03G 7/00 |
| | | | | 60/527 |

FOREIGN PATENT DOCUMENTS

| WO | WO 2004/028937 A2 | 4/2004 |
| WO | WO 2012/024636 A2 | 2/2012 |
| WO | WO 2012/024696 A2 | 2/2012 |
| WO | WO 2012/109559 A1 | 5/2012 |

OTHER PUBLICATIONS

Hawkes et al.; "Programmable Matter by Folding;" Proceedings of the National Academy of Sciences, vol. 107, No. 28; Jul. 13, 2010; www.pnas.org/cgi/doi/10.1073/pnas.0914069107: pp. 12441-12445.

Onal et al.; "Towards Printable Robotics: Origami-Inspired Planar Fabrication of Three-Dimensional Mechanisms;" 2011 IEEE International Conference on Robotics and Automation (ICRA); May 9-13, 2011; pp. 4608-4613.

Paik et al.; "Stretchable Circuits and Sensors for Robotic Oragami;" 2011 IEEE/RJS International Conference on Intelligent Robots and Systems; Sep. 25-30, 2011; pp. 414-420.

PCT Search Report and Written Opinion of the ISA dated Feb. 4, 2014; for PCT Pat. App. No. PCT/US2013/059110; 9 pages.

PCT International Preliminary Report on Patentability and Written Opinion of the ISA dated Mar. 26, 2015; for PCT Pat. App. No. PCT/US2013/059110; 9 pages.

* cited by examiner

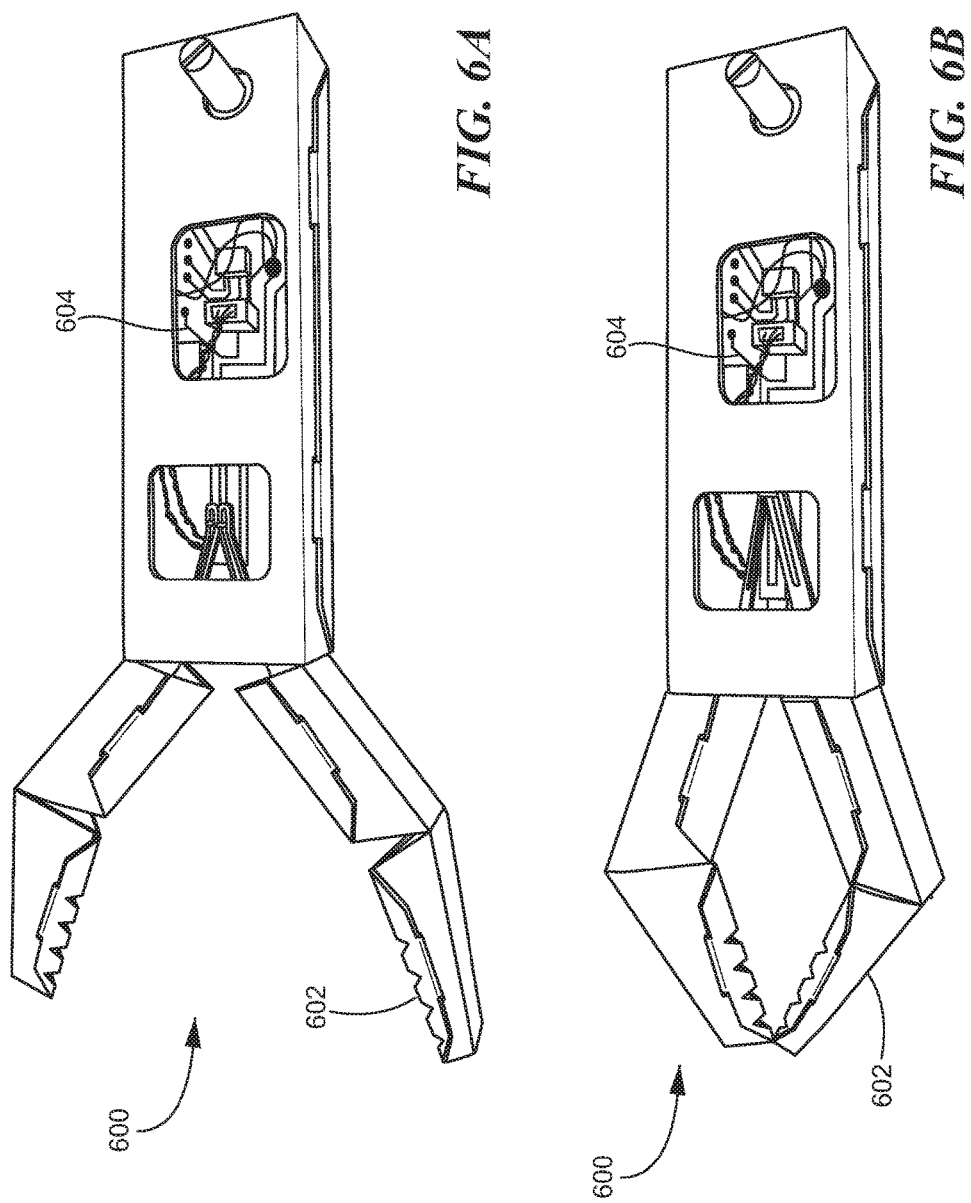

FOLDABLE MACHINES

RELATED APPLICATIONS

This application claims priority to and benefit of U.S. Provisional Patent Application No. 61/702,040, titled FOLDABLE MACHINES, filed Sep. 17, 2012, which is incorporated herein by reference in its entirety.

FEDERALLY SPONSORED RESEARCH

This invention was made with government support under Grant Nos. CCF-1138967 and EFRI-0735953 awarded by the National Science Foundation. The government may have certain rights in the invention.

BACKGROUND

The creation of new machines requires significant development time, financial resources, and technical expertise. While a wealth of tools exist for many robot development steps, there is not a single end-to-end process which begins with a novice user specifying a desired task and resulting in a fully functional robot able to perform that task.

An alternative to traditional machine design and fabrication may be referred to as "printable" and/or "foldable" machines. Such designs may utilize tools which are readily available, inexpensive to operate, and require minimal technical knowledge by a user.

As an illustrative example, assume a home owner needs a machine to explore areas of his basement in order to detect carbon monoxide and radon. The machine may be required to traverse a cluttered environment, carry a sensor, and report back to the user. Using traditional design and fabrication techniques to create such a machine may be time consuming and inconvenient for the user. However, if the user uses a foldable machine described below, the user may feed specifications to a foldable machine compiler, which chooses notional designs from a prepopulated database, refines geometries based upon the task to be performed, and produces detailed design and program files. The machine may then be fabricated from the design and program files, and the user may collect the machine and place it into operation.

In another example, a custom gripper may be desired for an electronics assembly line. The gripper could, for example, be utilized by a pick and place machine. The assembly line manager can specify traits of the part such as the mass and approximate geometry. These specifications may be provided to the foldable machine compiler and fabrication process to produce a custom gripper to meet the task needs.

SUMMARY

Methods to systematize the development of machines using inexpensive, fast, and convenient fabrication processes are disclosed. In an embodiment, a library of physical modules and their corresponding theoretical models are used. One advantage of such methods is that the deigns can be re-used based on a set of task criteria and custom parameters to tune the machine for use in a particular task. The resulting customized design, which may include a folding pattern and corresponding circuit design, can provide the blueprints for fabrication. The folding pattern may be provided (e.g. laser machined) on a flat sheet of substrate material, such as a polymer. The circuit pattern may be generated by etching or applying (e.g. sputtering) a copper foil layer onto the substrate. Circuit components and actuators may then be added at specified locations. The flat substrate may then be folded along the predefined locations to form the final machine.

BRIEF DESCRIPTION OF THE DRAWINGS

FIGS. 6A, 6B, and 6C are perspective views of a folded machine.

Like numbers in the drawings denote like elements. Connectors within circuit or block diagrams may represent single wires, buses, or other types of connections between blocks. A single connector line should not be construed to limit the type of connection to a single wire.

The figures, including the flowcharts and block diagrams, are provided for exemplary purposes and are not intended to limit the scope of this disclosure. Although the figures depict diagrams and flowcharts with particular numbers of blocks connected in particular arrangements or sequences, these are examples only. Other arrangements and sequences are within the scope of this disclosure.

DETAILED DESCRIPTION

FIGS. 1-5 illustrate one example of a foldable machine: a hexapod crawler machine. FIGS. 6-7 illustrate another example of a foldable machine: a two digit gripper. One skilled in the art will recognize that these are two examples of foldable machines and do not limit the scope of the disclosure; any type of two- or three-dimensional machine may be created using the methods described below.

In an embodiment, to create a foldable machine, a user may feed specifications to a foldable machine compiler, which may choose appropriate designs for completion of the specified task from a pre-populated database, refine geometries based upon the task to be performed, and produce detailed design and program files. The detailed design and program files may include a cutting pattern for cutting a template out of a sheet of substrate material, a circuit pattern for creating and populating a circuit on the template, and/or a folding pattern that can be applied to the template in order to form the template into the final machine.

Laser cutters, lamination, and PCB like component assembly followed by a final assembly that folds the substrate into its final form may be utilized. This so-called printable approach may allow for rapid development of low-cost machines using a general process that links specifications to prototypes, without requiring in-depth technical knowledge from the end user. The manufacturing process may include at least the following: (1) modeling of the machine; (2) parameter instantiation according to user specifications, i.e. modification of the model in order to tailor the machine to a particular task; (3) printed body fabrication; (4) printed electronics on the 2D body; (5) population of electronic components on the body; and (6) assembly of the 3D machine using folding. The resulting machines may be relatively light-weight (e.g. about 3 g) and may function as autonomous, programmable machines or robots. In an embodiment, a foldable machine may be fabricated in less than one day, less than 8 hours, less than four hours, less than two hours, less than one hour, or in any appropriate amount of time.

In an embodiment, the foldable machine compiler may operate similarly to programming language compilers that break down high-level specifications into functional component details. The foldable machine compiler may be able to choose from a large database of foldable machines and components, which may be pre-populated in the database by expert users.

Body Template

Figure 1:
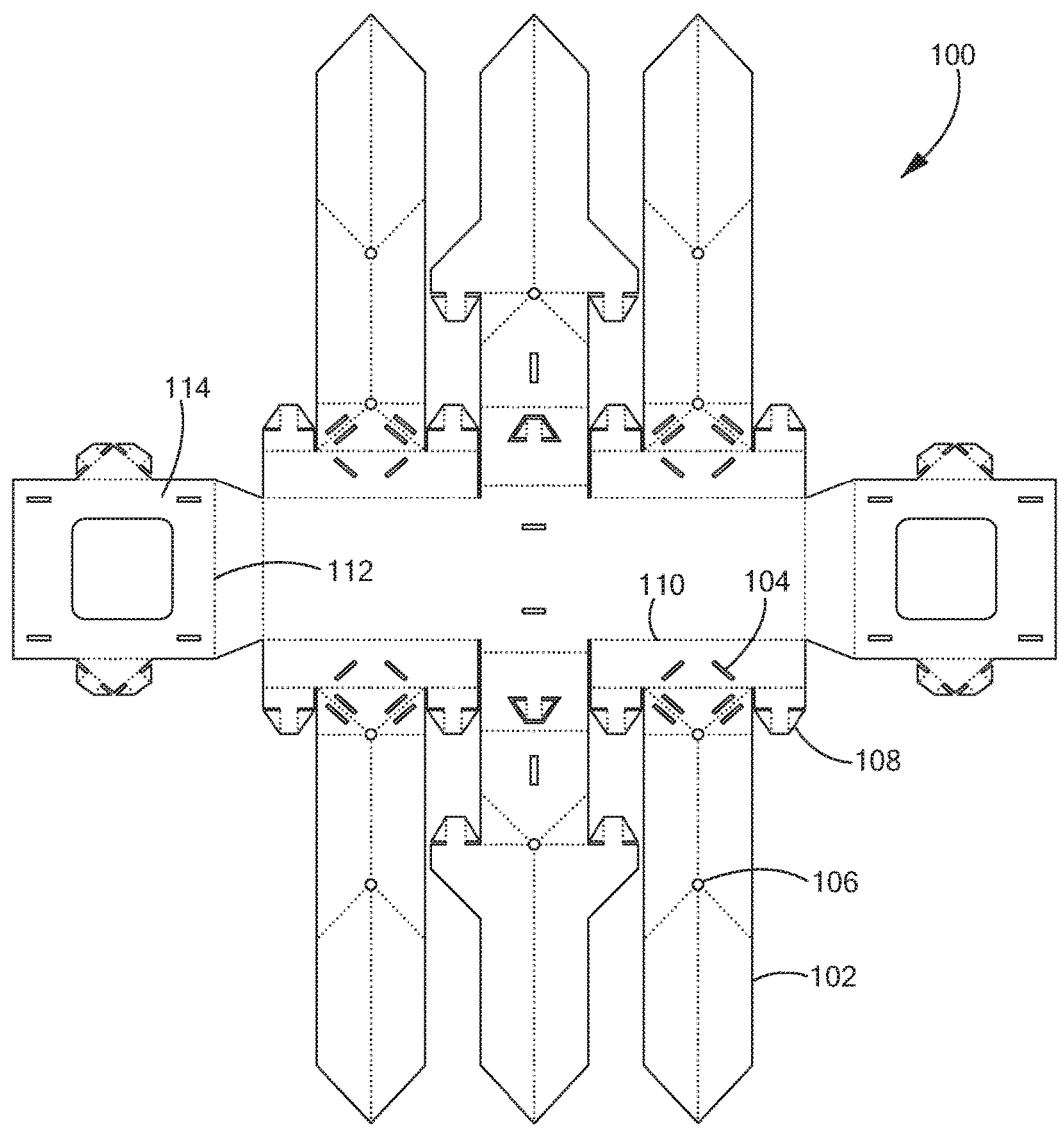
FIG. 1 is a plan view of a foldable substrate.

Referring to FIG. 1, a template 100 for forming a machine is shown. In an embodiment, the template 100 may be formed from, e.g. cut out of, a stock sheet of substrate. The substrate can be made of any appropriate material including plastics, cellulose, amalgam, or any other type of material that can be cut to form a template 100. For example, the substrate may be polyetheretherketone (PEEK) having a width of about 0.125 mm, 5 mils, or any other appropriate width.

In an embodiment, the substrate material may be sufficiently foldable or flexible so that the template 100 can be folded into the shape or body of a machine, and so that parts or features of the body can move, bend, flex, and actuate as desired. The material may also be sufficiently stiff so that the machine can hold its shape and perform tasks (e.g. carrying a load) once folded into a final form.

FIG. 1 illustrates a template 100 that has been cut from a stock sheet. In an embodiment, the stock sheet can be etched, cut, and/or perforated so that a border 102 of the template 100 is formed. During the process, the stock sheet can be cut so that unnecessary material (i.e. substrate material that is not part of the template) can be removed, leaving only the template 100 behind.

The template may also include various cutouts, such as cutout 104 and hole 106. These cutouts and holes may be used for various purposes. For example, cutout 104 may be designed to accept a tab, such as tab 108, during folding. When the tab 108 is inserted into the cutout 104, it may provide stability and structure to the body of the machine once the substrate is folded. As another example, the hole 106 may provide a portion of the body with additional flexibility. For example, the hole 106 may be placed at a movable joint. Having hole 106 at the joint location may allow the joint to move more freely once the body is folded into its final form.

The template may include additional holes (not shown) that can be used to accept through-hole electronic components, such as through hole chips, resistors, capacitors, etc. These additional holes may also be used to accept or mount electromechanical actuators that can allow the machine, once assembled in a final form, to move.

The template 100 may also include various fold lines 110. These fold lines may define a folding pattern for the template 100. In other words, once the template is folded according to the fold lines 110, the template may be formed into the body of a machine.

The fold lines 110 may, in an embodiment, be perforated lines (i.e. a series of small holes) in the template 100. The size of the holes and the distance between the holes may vary based upon the application. If the fold lines 110 are perforated, the lines may be folded in either direction. For example, if the fold line 112 is a perforated line, the square structure 114 may be folded up and over the remainder of the template 100, or may be folded down and under the remainder of the template 100 with equal ease.

In another embodiment, the fold lines 110 may be etched into the template 100. In other words, the fold lines 110 may be cut partway into the template 100 without cutting all the way through the template 100. If the fold lines 110 are etched, it may be easier to fold along the fold lines 100 in one direction. Therefore, in an embodiment, etched fold lines 100 can be used to define a direction in which the template should be folded. For example, if the fold line 112 is etched into the top of the template 100, then it may be easier to fold the square structure 114 up and over the remainder of the template 100. On the other hand, if the fold line 112 is etched into the bottom of the template 100, then it may be easier to fold the square structure 114 down and under the remainder of the template 100. These etched fold lines can help guide a user as to which way the template 100 should be folded.

In an embodiment, the template 100 may be machined from a substrate material. For example, the raw substrate material may be exposed to a laser cutting tool, or any other type of tool, that can cut the template 100 out from the raw substrate material. The cutting tool may also cut out cutouts such as cutout 104 and cut out holes such as hole 106. The cutting tool may also perforate or etch fold lines in the template 100, such as fold line 110.

In operation, the cutting tool may receive a cutting pattern from a foldable machine database that defines the template and its features, as will be discussed below. The cutting tool may then automatically cut and etch the template 100 from the stock substrate material.

Circuitry

Figure 2A:
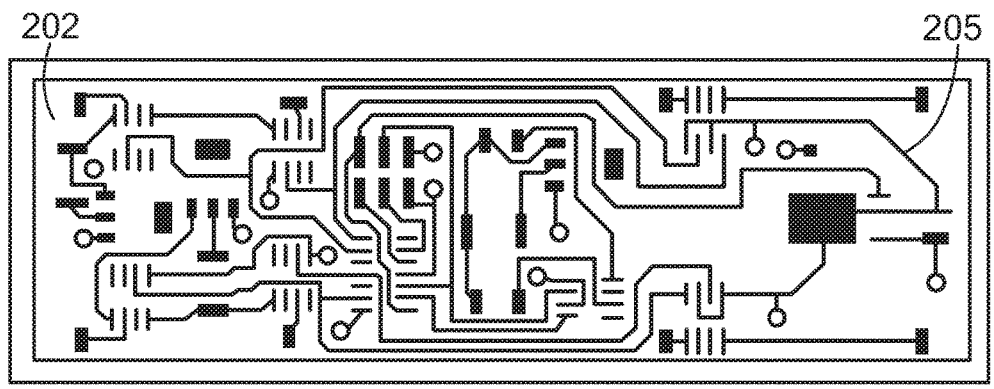
FIGS. 2A-2F are a series of line drawings of a process for printing and populating circuits.
Figure 2B:
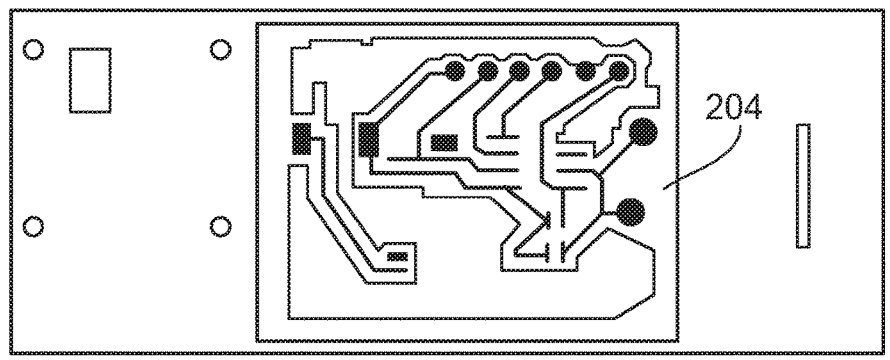
Figure 2C:
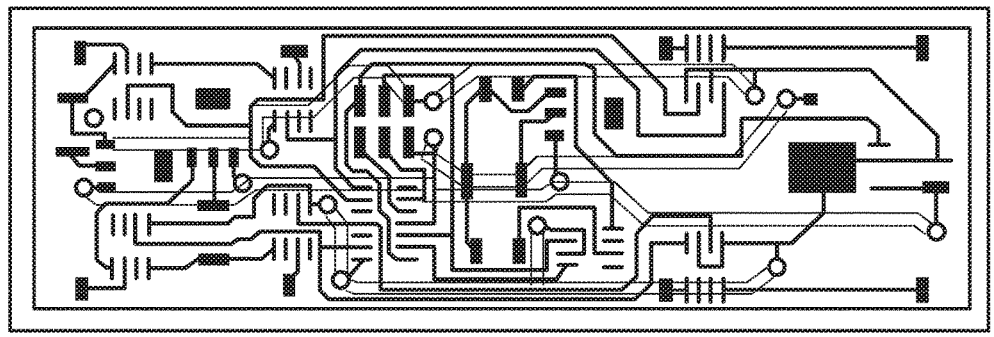
Figure 2D:
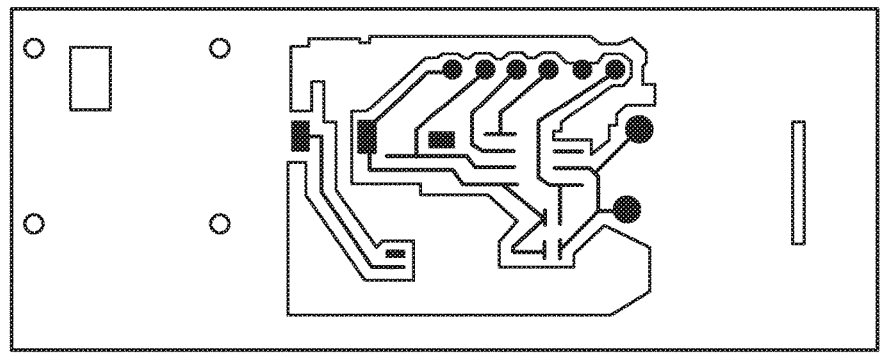

Once the template has been formed, a circuit may be printed and populated on the template. Referring to FIGS. 2A-2F, a process for printing a populating circuitry onto the template 100 is shown. As shown, in FIGS. 2A and 2B, a printed circuit mask on a copper foil 202 and/or 204 may be defined. The masks 202 and 204 may define circuit traces 205 that will be formed on the template 100. The foil 202 and/or 204 may then be applied to the template, and the excess copper (i.e. the copper not covered by the mask material) may be chemically etched away, leaving the circuit traces defined by the mask behind as shown in FIG. 2C and FIG. 2D. The masking and etching process is a subtractive process (i.e. a process that removes material by etching) and can be used to create conductive traces and planes on the template 100. The circuit can be printed with a solid ink printer and the material can be etched away using a chemical etching process, such as a ferric-chloride etch.

In an embodiment, an additive process can also be used to create conductive traces and planes. For example, processes known in the art that sputter or add conductive material to the template in desired locations can be used to create the circuit traces and planes.

In some instances, the conductive traces and planes may cross over the fold lines 110 so that, when the template 100 is folded, the conductive traces and planes are also folded. Accordingly, a conductive material (e.g. a copper foil or the like) that is resistant to folding can be used so that the traces do not break when the template 100 is folded into its final form.

Figure 2E:
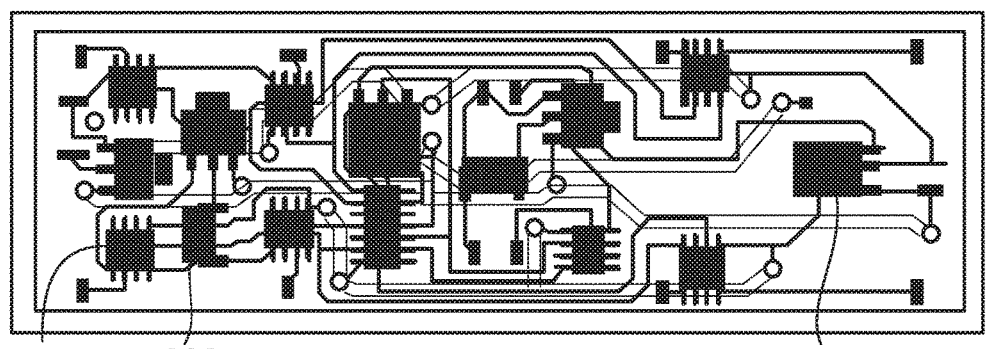
Figure 2F:
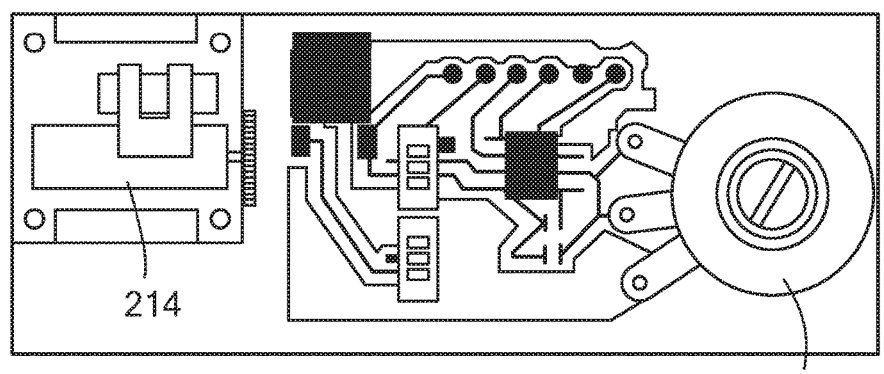

Once the conductive traces are formed, the circuit can be populated with electronic components as shown in FIGS. 2E and 2F. As shown, surface mount components such as chip 206, resistor 208, or voltage regulator 210 can be mounted on the template 100. In an embodiment, a pick and place machine can place the components, then a soldering process (e.g. wave soldering and the like) can solder the components onto the surface of the template 100. Other processes can also be used place and solder the components, such as manual placing and soldering, or other automated manufacturing processes that place and solder electronic components.

As shown in FIG. 2F, components such as a potentiometer 212 and an actuator (shown as a motor 214) can also be added to the template 100. These components can also be soldered in place, or can be mounted in place with screws, tacks, adhesive, or any other method of mounting. Although not shown, through hole components can also be added and soldered to the template 100.

Final Assembly

Figure 3:
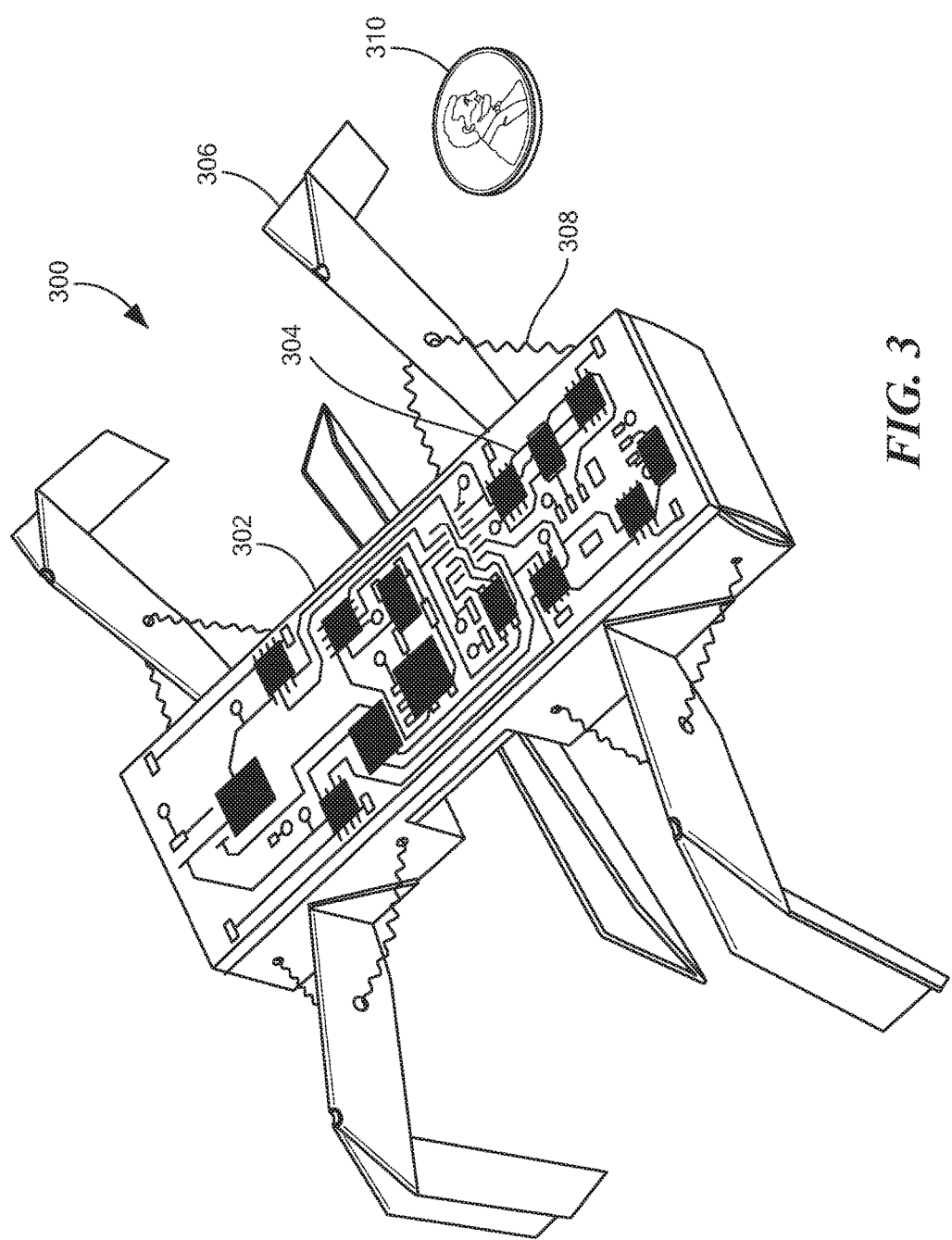
FIG. 3 is a perspective view showing a folded machine.

Referring now to FIG. 3, a final assembly of a foldable machine 300 is shown. After the circuitry has been populated, the two-dimensional template 100 can be folded along the fold lines 110 to form a three-dimensional body 302 of the machine 300. As shown, the template 100 of FIG. 1 can be folded to form a six-legged crawler machine 300. The circuitry 304 may control the movement of the crawler machine 300, and may be able to move the legs (e.g. leg 306) of the crawler machine 300 so that the crawler machine 300 propels itself forward or backward, turns in place, and/or steers and turns as desired.

In an embodiment, the circuitry 304 can include a processor (e.g. a microprocessor or the like), a volatile or non-volatile memory, and computer readable instructions stored in the memory which, when executed by the processor, cause the machine 300 to perform functions such as walking, taking sensor readings, etc.

The crawler machine 300 can also include linear actuators 308 for moving the legs 306 back and forth. In an embodiment, these linear actuators may be wire that is coiled around the shaft of a motor so that the motor, when activated, can pull on the leg 306. In another embodiment, these linear actuators may be NiTi SMA coil springs that are actuated by a phase transition based on temperature. In other words, when the linear actuator is heated, it may retract. By providing an electrical current through the actuator 308, the actuator 308 may heat up and retract, thus pulling the leg 306.

As shown, each leg 306 may have two actuators 308 connected so that the leg 306 can be pulled forward, when one actuator 308 is retracted, and backward, when the other actuator 308 is retracted. The circuitry 304 can control the actuators 308 attached to each leg 306 so that the crawler machine 300 can move.

Although the circuitry 304 is shown on the outside surface of the crawler machine 300, the circuitry 304 can alternatively or additionally be located on an inside surface of the crawler machine 300. Also, although the crawler machine is shown with reference to a penny 310, the crawler machine 300 (or other foldable machines) can be produced in any desired size.

Figure 4:
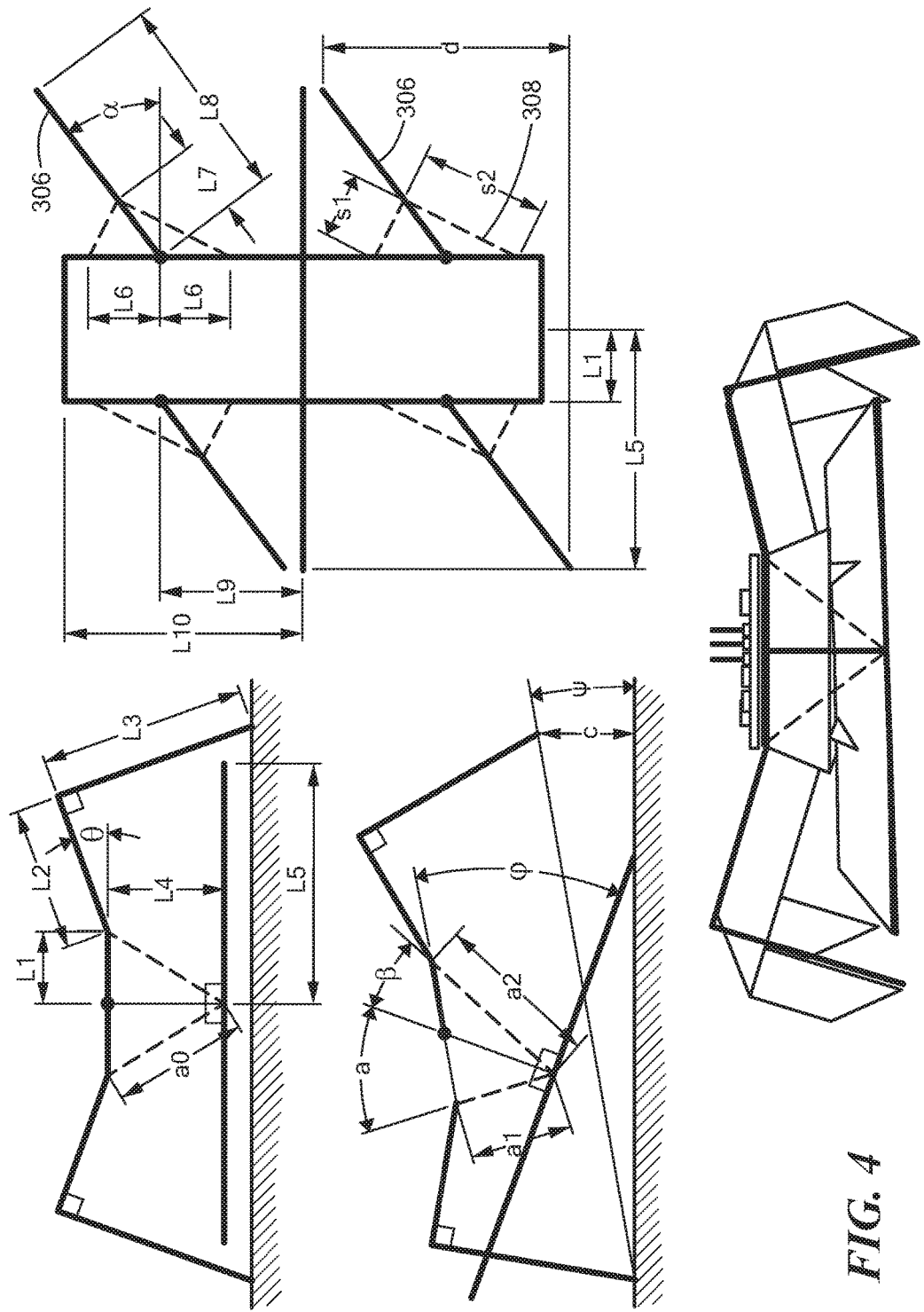
FIG. 4 is a series of diagrams illustrating articulation of a folded machine.
Figure 5:
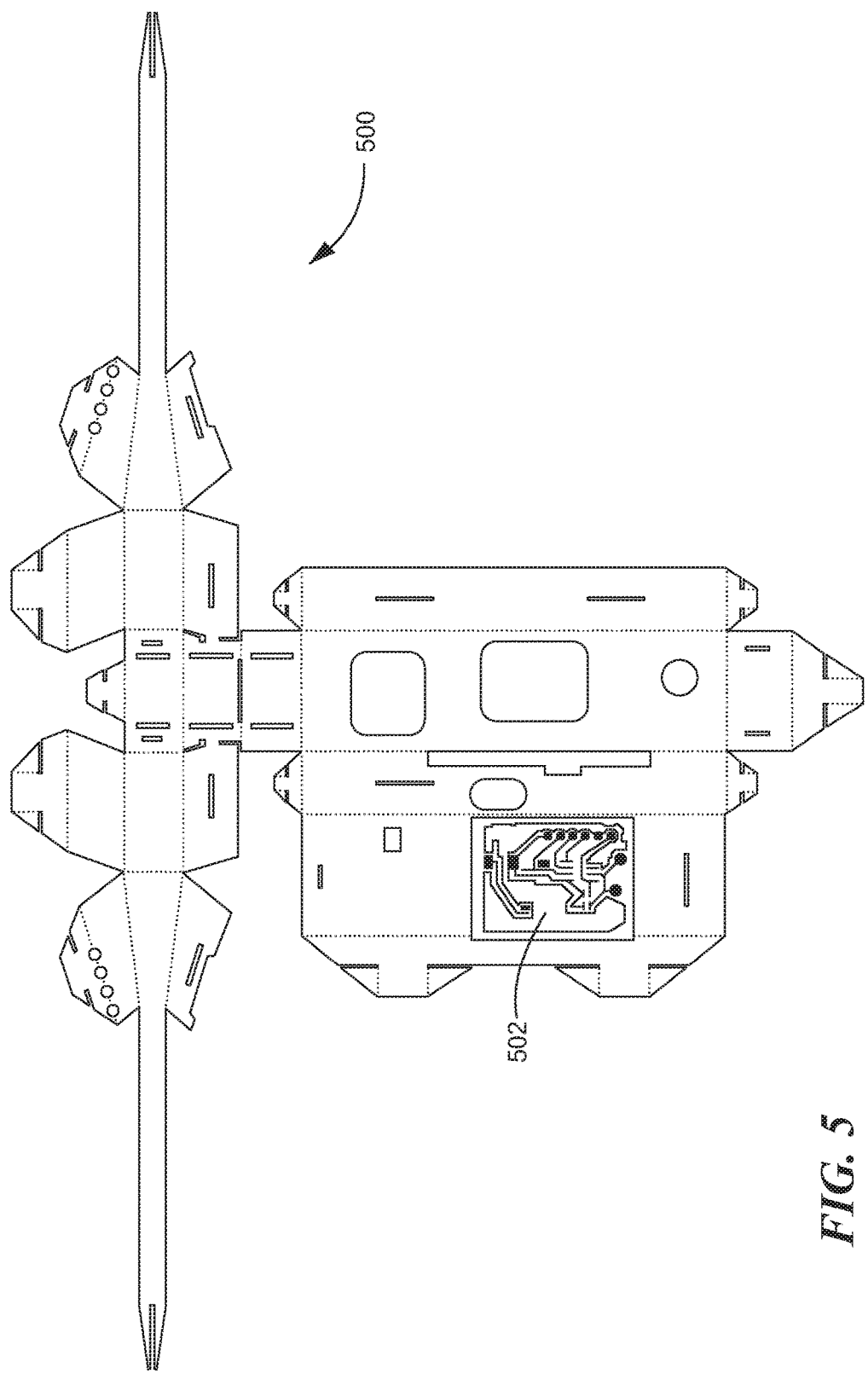
FIG. 5 is a plan view of a foldable substrate.

Referring now to FIG. 4, diagrams of the final assembly of a crawler machine 300 are shown to illustrate articulation and movement of the legs 306. As shown in diagram 400, the actuators 308 can pull the legs 306 forward and backward to allow the crawler machine 300 to move. The legs can be moved individually or simultaneously. Depending upon the sequence of leg movement, the crawler machine 300 can move forward, backward, or can turn. For example, if the legs on only one side of the crawler machine 300 are actuated, the crawler machine 300 may move in an arc. Alternatively, if the legs 306 on one side of the crawler machine 300 are actuated in a forward pattern, and the legs 306 on an opposing side of the crawler machine 300 are actuated in a reverse pattern, the crawler machine 300 may spin so that it is facing a new direction.

As shown by the images in FIG. 4, the crawler machine 300 can also climb over obstacles.

Referring to FIG. 5 and FIGS. 6A-6C, an additional embodiment of a foldable machine for gripping objects is shown. A template 500 may be cut from stock substrate material in a similar manner to the process described above. The template 500 may include circuitry 502 that can be printed and populated on the surface of the template 500, as described above. However, the template 500 may have a shape and folding pattern designed to form a gripping tool, rather than a crawler machine.

Figure 6C:
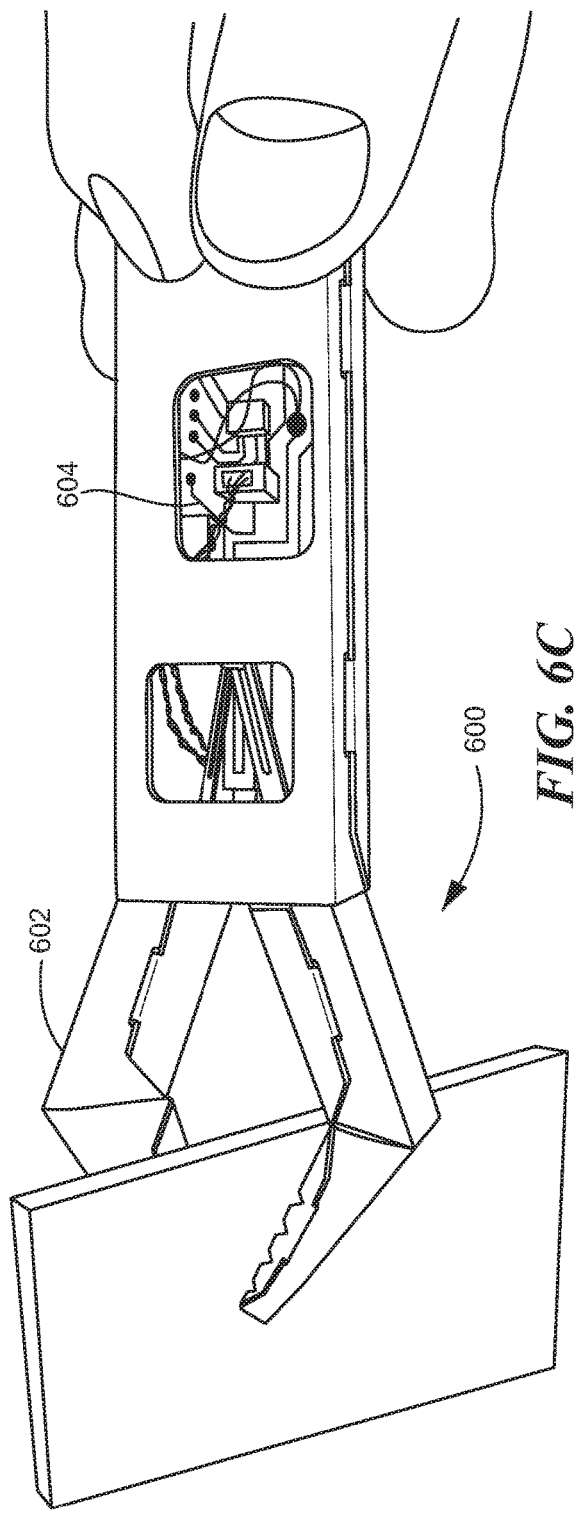
Figure 7:
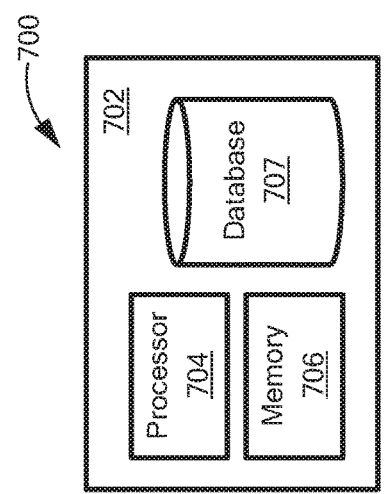
FIG. 7 is a block diagram of a computer architecture including a database for storing models of foldable machines.

FIGS. 6A-6C are perspective views that illustrate the final assembly of the gripping tool. As shown, the gripping tool 600 has pincers 602 that can be opened and closed by circuitry 604. The pincers 600 can be used to grasp objects and may be useful, for example, to grab objects that are dangerous to touch, such as hot or acidic objects. The gripping tool 600 may also be useful to grab hard-to-reach objects where a human hand cannot reach, and may also be useful as a tool for manufacturing. For example, the gripping tool 600 could be installed in a pick and place machine where it is used to select and place electronic components onto a printed circuit board.

Modeling

In various embodiments, methods of fabricating machines by printing and/or folding processes may utilize a database of system components such as actuators, sensors, processors, materials, final assemblies, folding patterns, cutout patterns, substrates, and user-specified constraints. The database can include parameterized expert-designed components (e.g. a crawler machine body shape with a variable number of legs, a leg with variable size, etc.). Each component within the database may be represented by a class where some of its properties can vary. The physical characteristics of each component (e.g., its mechanical properties, weight, and power consumption) can be determined and included in the class. The database can be updated as users design and fabricate new robots.

A modeling engine may be associated with each component in the database. This engine can be used to select the approximate desired parameters that match the user specification. For example, the modeling engine can be used to select materials and/or patterns to create a crawler machine having 6 legs capable of carrying a radon sensor and covering a 200 m2 space within 24 hours.

In an embodiment, the database may include a library of models that provide fundamental robotic capabilities such as locomotion or manipulation. In an embodiment, the library can be stored in a database.

Turning to FIG. 7, a block diagram of a computer architecture 700 for storing a library of models is shown. In an embodiment, a computer 702 (or a series of computers connected by a network) includes a processor or series of processors 704 and a volatile or non-volatile memory or series of memories 706. Computer readable instructions stored in the memory 704 may be executed by the processor 702.

The computer 702 may also include a database or series of databases 708 that can be stored on a hard drive or other storage device. The database 708 may be any database, relational or otherwise, known in the art that can store data such as model data for foldable machines.

The models sometimes include engineering trade-offs between system specifications that may be different for every application. Using a model database 808, a user can request a design that meets high-level specifications without requiring a detailed technical design. A high-level specification may include information such as: "a crawling robot to map radon levels in a basement."

Figure 8:
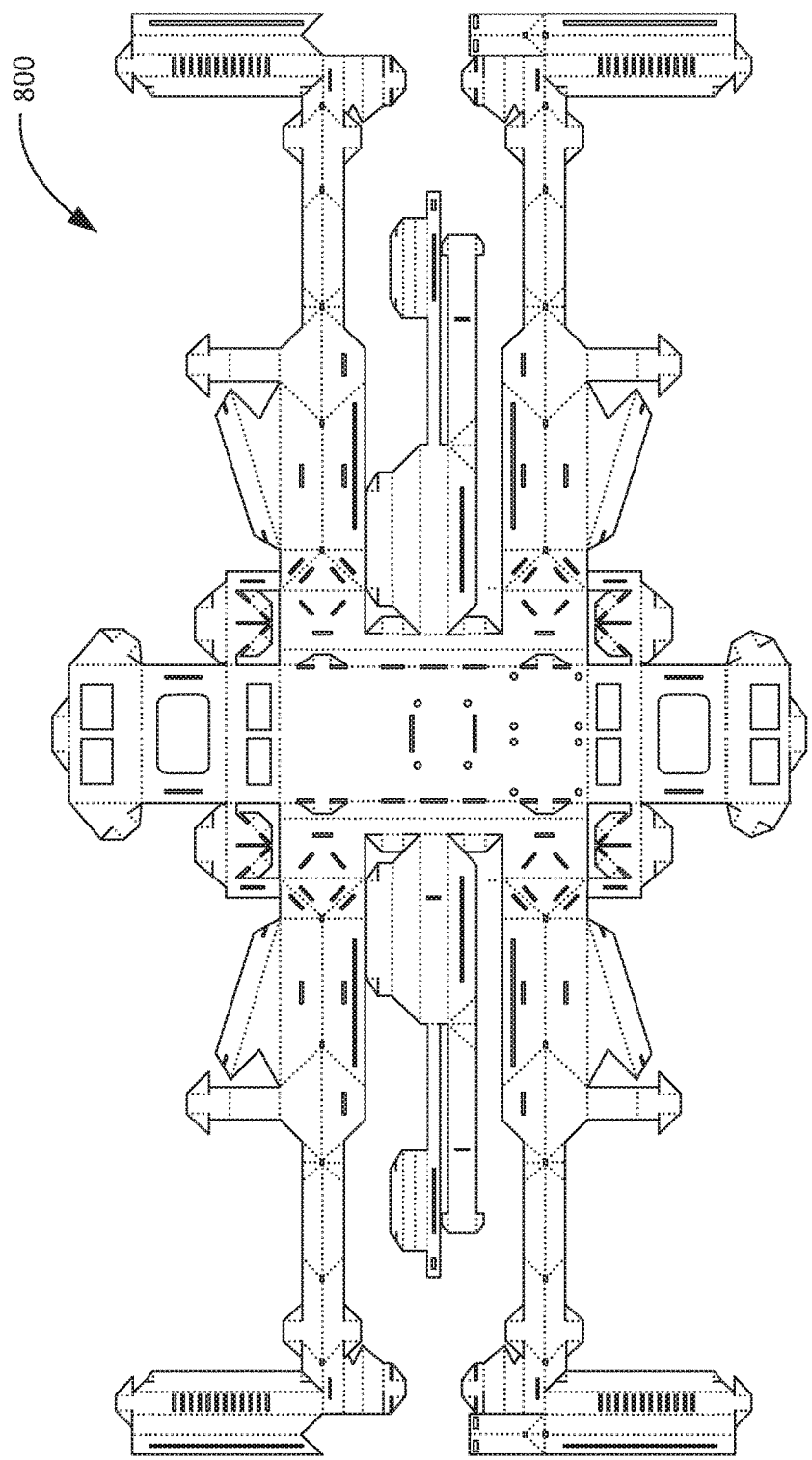
FIG. 8 is an image representing data that can be stored in a foldable machine database.

Referring now to FIG. 8, a diagram of a model 800 is shown. In an embodiment, the model 800 may be represented by data stored in the database 707. The data may represent a pattern, such as that shown in FIG. 8, that represents a model of a foldable machine and can be used to fabricate the folded machine. The model 800 may include borders, cutouts, shapes, circuit locations, circuit components, folding patterns, or any other information that can be used to define a foldable machine.

Fabrication Process

In an embodiment, a process for fabricating a foldable machine includes storing models for folding machines in a database. A user may then specify high level goals to be achieved, such as "detect radon gas in a basement." The database may then select a model that can be fabricated into a foldable machine to perform the task.

In certain circumstances, the model can be modified based on specific task needs. For example, a user can specify the weight of a radon detector to be carried by the machine, the size of the basement to be traversed, the height of obstacles that the machine must walk over, etc. These requirements can be used to modify the model prior to fabrication. For example, if the basement to be traversed is large, the model may be modified to include a power source (e.g. battery) that has enough stored power so that the foldable machine can traverse the large basement. As another example, if the radon detector has a particular weight, the model can be modified so that the material and/or the folding pattern used is sufficiently strong to carry the radon detector.

Once the model is chosen, the model may be fed into a cutting tool, such as an automated laser cutting machine, which will cut a template for the machine out of a stock sheet of material. Holes, folding patterns, and other features can also be cut into the template.

A circuit can then be formed on one or more surfaces of the template, through a subtractive or additive process, as described above. Circuit components and actuators can be populated and mounted on the template to complete the circuit.

Once populated, the template can be folded into the final form of the foldable machine. The final form can be a two- or three-dimensional machine tailored to perform the specific task identified by the user. After the machine is folded, additional electrical components can be added to the machine if needed or desired. The machine can then be put into use to complete the specified task.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, the scope of the patent should not be limited to the described embodiments but rather should be limited only by the spirit and scope of the following claims.

What is claimed is:

1. A method for fabricating a machine, the method comprising:
    defining a set of machine parameters which define a machine for accomplishing a task, the machine parameters comprising a folding pattern for forming the machine from a foldable substrate and circuit locations for placement of circuits on the substrate;
    storing the set of machine parameters as a machine model in a computer storage;
    applying the folding pattern to at least one surface of the substrate;
    forming one or more conductive signal paths directly on at least one surface of the substrate, wherein forming one or more conductive signal paths includes etching a circuit pattern on a conductive foil layer disposed on the at least one surface of the substrate such that the conductive signal paths correspond to metallic traces disposed on the at least one surface of the substrate and such that at least one of the conductive signal paths is formed across a fold of the folding pattern;
    disposing circuit components directly on one or more surfaces of said substrate such that the circuit components are directly electrically coupled to the conductive signal paths thereby forming one or more electrical circuits; and
    folding the substrate according to the folding pattern, such that the substrate is folded into the machine wherein the machine is provided having moving parts controlled by the electrical circuits and wherein folding the substrate includes folding the at least one conductive signal path that crosses the fold.

2. The method of claim 1 further comprising adapting the machine model according to user specifications.

3. The method of claim 1 wherein folding the substrate comprises modifying a substrate into a shape defined by the machine model.

4. The method of claim 3 wherein modifying a substrate comprises modifying a substantially flat substrate.

5. The method of claim 4 wherein modifying the substantially flat substrate includes cutting a shape from a piece of stock substrate.

6. The method of claim 1 wherein the machine is autonomously functioning.

7. The method of claim 1 wherein the substrate is a polymer substrate.

8. The method of claim 1 wherein the substrate has a thickness of about 5 mils to about 10 mils.

9. A method for fabricating a machine, the method comprising:
    defining a set of machine parameters which define a machine for accomplishing a task, the machine parameters comprising a folding pattern for forming the machine from a foldable substrate and circuit locations for placement of circuits on the substrate;
    storing the set of machine parameters as a machine model in a computer storage;
    providing the folding pattern on at least one surface of the substrate;
    creating electrical circuits directly on at least one surface of the substrate including:
        forming conductive signal paths comprising metallic traces on the at least one surface of the substrate; and
    folding the substrate and the conductive signal paths according to the folding pattern, such that the substrate is folded into the machine wherein the machine is provided having moving parts controlled by the electrical circuits;
    wherein
        forming the conductive signal paths includes etching a circuit pattern on a conductive foil layer disposed on the substrate thereby providing the one or more conductive signal paths as etched conductive foil signal paths and forming at least one of the conductive signal paths across a fold of the folding pattern; and folding the substrate includes folding the at least one conductive signal path that crosses the fold.

10. The method of claim 9 wherein conductive signal paths that cross a fold comprise a foldable material so that the metallic traces do not break when the substrate is folded.

11. A method for fabricating a machine, the method comprising:

providing a folding pattern on at least one surface of a substrate;

forming one or more conductive signal paths directly on at least one surface of the substrate, wherein the conductive signal paths comprise conductive metallic traces that cross a fold of the folding pattern;

disposing circuit components directly on one or more surfaces of said substrate such that the circuit components are directly electrically coupled to the conductive signal paths thereby forming one or more electrical circuits; and folding the substrate and the metallic traces that cross a fold, according to the folding pattern, such that the substrate and at least one of the metallic traces are folded into the form of the machine, wherein the machine is provided having moving parts controlled by the electrical circuits;

wherein forming the one or more conductive signal paths comprises etching a circuit pattern on a conductive foil layer disposed on the substrate thereby providing the one or more conductive signal paths as etched conductive foil signal paths.

12. A method for fabricating a machine, the method comprising:

defining a set of machine parameters which define a machine for accomplishing a task, the machine parameters comprising a folding pattern for forming the machine from a foldable substrate and circuit locations for placement of circuits on the substrate;

storing the set of machine parameters as a machine model in a computer storage;

applying the folding pattern to at least one surface of the substrate;

forming one or more conductive signal paths directly on at least one surface of the substrate wherein forming one or more conductive signal paths directly on at least one surface of the substrate comprises etching a circuit pattern on a conductive foil layer disposed on the substrate thereby providing the one or more conductive signal paths as etched conductive foil conductive signal paths;

disposing circuit components directly on one or more surfaces of said substrate such that the circuit components are directly electrically coupled to the etched conductive foil conductive signal paths thereby forming one or more electrical circuits; and folding the substrate according to the folding pattern, such that the substrate is folded into the machine such that the machine is provided having moving parts controlled by the electrical circuits wherein:

forming one or more conductive signal paths includes forming at least one of the conductive signal paths across a fold of the folding pattern; and folding the substrate according to the folding pattern includes folding the at least one conductive signal path that crosses the fold.

\* \* \* \* \*

UNITED STATES PATENT AND TRADEMARK OFFICE
CERTIFICATE OF CORRECTION

PATENT NO. : 9,686,867 B2
APPLICATION NO. : 13/723364
DATED : June 20, 2017
INVENTOR(S) : Daniela Rus et al.

It is certified that error appears in the above-identified patent and that said Letters Patent is hereby corrected as shown below:

In the Specification

Column 5, Line 5, delete "used place" and replace with --used in place--

Signed and Sealed this
Twentieth Day of February, 2018

Andrei Iancu
*Director of the United States Patent and Trademark Office*